United States Patent [19]
Owen et al.

[11] Patent Number: 5,841,099
[45] Date of Patent: *Nov. 24, 1998

[54] METHOD EMPLOYING UV LASER PULSES OF VARIED ENERGY DENSITY TO FORM DEPTHWISE SELF-LIMITING BLIND VIAS IN MULTILAYERED TARGETS

[75] Inventors: Mark D. Owen, Portland; Bonnie A. Larson, Hillsboro, both of Oreg.; Jozef Van Puymbroeck, Oostkamp, Belgium

[73] Assignee: Electro Scientific Industries, Inc., Portland, Oreg.

[ * ] Notice: The term of this patent shall not extend beyond the expiration date of Pat. No. 5,593,606.

[21] Appl. No.: 651,036

[22] Filed: May 17, 1996

Related U.S. Application Data

[63] Continuation-in-part of Ser. No. 276,797, Jul. 18, 1994, Pat. No. 5,593,606.
[51] Int. Cl.$^6$ .................................................. B23K 26/00
[52] U.S. Cl. ............................... 219/121.69; 219/121.71; 219/121.55
[58] Field of Search .................. 219/121.61, 121.69, 219/121.7, 121.71, 121.77, 121.85, 95; 264/400; 358/297; 427/97, 555; 216/17, 65; 156/644.1, 643.1

[56] References Cited

U.S. PATENT DOCUMENTS

| | | |
|---|---|---|
| 3,632,398 | 1/1972 | Konig . |
| 3,931,458 | 1/1976 | Dini ........................................ 358/297 |
| 3,999,004 | 12/1976 | Chirino et al. . |
| 4,258,468 | 3/1981 | Balde ........................................ 29/830 |
| 4,414,059 | 11/1983 | Blum et al. ........................... 219/121.85 |
| 4,622,058 | 11/1986 | Leary-Renick et al. ........ 219/121.71 X |
| 4,644,130 | 2/1987 | Bachmann ........................... 219/121.69 |
| 4,684,437 | 8/1987 | Donelon et al. ............................ 216/66 |
| 4,789,770 | 12/1988 | Kasner et al. ......................... 219/121.7 |
| 4,832,788 | 5/1989 | Nemiroff . |

(List continued on next page.)

FOREIGN PATENT DOCUMENTS

| | | |
|---|---|---|
| 0580408 | 1/1994 | European Pat. Off. ........ B23K 26/00 |
| 223326 | 6/1985 | Germany . |
| 59-27791 | 2/1984 | Japan ................................. 219/121.71 |
| 63-112088 | 5/1988 | Japan ................................. 219/121.61 |
| 3-66488 | 3/1991 | Japan ................................. 219/121.71 |

(List continued on next page.)

OTHER PUBLICATIONS

Martyniuk, J. "UV laser–assisted wire stripping and micro–machining." Proceedings of SPIE vol. 2062, Lasers as Tools for Manufacturing, pp. 30–38, Sep. 8, 1993.

Lizotte et al., "Laser Drilling Speeds BGA Packaging," Solid State Laser Technology, pp. 120–128, Sep. 1996 (Westlaw™ printout).

Kulina et al., "Material bearbeitung durch Laserstrahl"— English translation, no date available.

(List continued on next page.)

Primary Examiner—Gregory L. Mills
Attorney, Agent, or Firm—Stoel Rives LLP

[57] ABSTRACT

The output of a continuously pumped, Q-switched, Nd:YAG laser (10) is frequency converted to provide ultraviolet light (62) for forming vias (72, 74) in targets (40) having metallic layers (64,68) and a dielectric layer (66). The invention employs a first laser output of high power density to ablate the metallic layer and a second laser output of a lower power density to ablate the dielectric layer. The parameters of the output pulses (62) are selected to facilitate substantially clean, sequential drilling or via formation. These parameters typically include at least two of the following criteria: power density first above and then below the ablation threshold of the conductor, wavelength less than 400 nm, a temporal pulse width shorter than about 100 nanoseconds, and a repetition rate of greater than about one kilohertz. The ability to generate ultraviolet light output pulses at two power densities facilitates the formation of depthwise self-limiting blind vias in multilayer targets, such as a target composed of a layer dielectric material covered on either surface by a layer of metal.

43 Claims, 15 Drawing Sheets

U.S. PATENT DOCUMENTS

| | | |
|---|---|---|
| 4,894,115 | 1/1990 | Eichelberger et al. ............ 219/121.69 |
| 4,915,981 | 4/1990 | Traskos et al. . |
| 4,930,901 | 6/1990 | Johnson et al. ........................... 372/26 |
| 4,970,369 | 11/1990 | Yamazaki et al. ................. 219/121.85 |
| 5,010,232 | 4/1991 | Arai et al. ............................. 219/121.7 |
| 5,063,280 | 11/1991 | Inagawa et al. ...................... 219/121.7 |
| 5,066,357 | 11/1991 | Smyth, Jr. et al. ................. 219/121.69 |
| 5,073,687 | 12/1991 | Inagawa et al. ...................... 219/121.7 |
| 5,087,396 | 2/1992 | Zablotny et al. . |
| 5,108,785 | 4/1992 | Lincoln et al. ........................... 427/96 |
| 5,153,408 | 10/1992 | Handford et al. ................. 219/121.64 |
| 5,168,454 | 12/1992 | LaPlante et al. ..................... 219/121.8 |
| 5,194,713 | 3/1993 | Egitto et al. ........................ 219/121.71 |
| 5,227,013 | 7/1993 | Kumar ................................. 156/644.1 |
| 5,293,025 | 3/1994 | Wang ................................. 219/121.71 |
| 5,316,803 | 5/1994 | White, Jr. et al. ...................... 427/554 |
| 5,378,869 | 1/1995 | Marrs et al. ........................ 219/121.71 |
| 5,536,579 | 7/1996 | Davis et al. ..................... 219/121.6 X |
| 5,593,606 | 1/1997 | Owen et al. ........................ 219/121.71 |
| 5,731,047 | 3/1998 | Noddin .................................... 427/555 |

FOREIGN PATENT DOCUMENTS

| | | | |
|---|---|---|---|
| 8-2196 | 7/1997 | Japan . | |
| 1750900 | 7/1992 | U.S.S.R. ............................. 219/121.7 | |
| 02351 | 2/1996 | WIPO ............................ B23K 26/00 | |
| 12830 | 5/1996 | WIPO ............................ C23C 14/04 | |

OTHER PUBLICATIONS

Brannon, J.H., "Excimer–Laser Ablation and Etching," Circuits & Devices magazine, Sep. 1990 pp. 19–24.

Cole, H.S., Liu, Y.S., and Philipp, H.R., "Dependence of photoetching rates of polymers at 193 nm on optical absorption depth," Appl. Phys. Lett., vol. 48, No. 1, 6 Jan. 1986, pp. 76–77.

Dyer, P.E., and Sidhu, J., "Spectroscopic and fast photographic studies of excimer laser polymer ablation," J. Appl. Phys. 64 (9), 1 Nov. 1988, pp. 4657–4663.

4420 Laser Micromachining System –ESI Brochure (2 pages), Sep. 1993.

ESI, "Model 4570 Series Lasers Service Guide," Feb. 1994, (REV. E. Mar. 31, 1998).

Ewing, J.J., "Advanced solid–state lasers challenge conventional types," *Laser Focus World,* Nov. 1993, pp. 105–110.

Hobbs, Jerry R., "Electronics makers switch to precise micromachining tools," Laser Focus World, Mar. 1994, pp. 69–72.

Kulina et al., "Material bearbeitung durch Laserstrahl" no date available.

Lee, Rex A. and Moreno, W.A., Excimer vs. ND:YAG Laser Creation of Silicon Vias for 3D Interconnects, IEEE, 1992, pp. 358–360.

Liu, Y.S., Cole, H.S., and Guida, R., "Laser ablation of polymers for high–density interconnect," Microelectronic Engineering 20 (1993) 15–29 , 1993 Elsevier Science Publishers B.V., pp. 15–29.

Mahan, G.D., et al. "Theory of polymer ablation," Appl. Phys. Lett. 53 (24), 12 Dec. 1988, pp. 2377–2379.

Owen, Mark, New Technology for Drilling Through –and Blind–Vias in Copper Clad Reinforced Circuit Boards, IPC Proceedings, May 1995.

Saunders & Dolleymore, Dec. 2, 1997 third party comments (pp. 1–6 and sections 1 and 2), and EPO Form 2022.

Saunders & Dollymore, Nov. 13, 1997 third party comments (pp. 1–3), and EPO Form 2022.

Srinivasan, R., and Braren R., "Ultraviolet Laser Ablation of Organic Polymers," *Chemical Reviews,* 1989, vol. 89, No. 6.

Tessier, Theodore G. and Chandler, Jerry, "Compatibility of Common MCM–D Dielectric with Scanning Laser Ablation Via Generation Processes," IEEE (1993), pp. 39–45.

"Trepanning Moves in on Mini Holes," Machinery and Production Engineering, 2 Nov. 1983, pp. 42–43.

Wiener–Avnear, Eli, "Lasers cut microscopic paths with major potential," Laser Focus World, Jul. 1993, pp. 75–80.

Wu et al., "Single–Shot Excimer Laser Ablation of Thick Polymar Desists on Metallic Substrates," AMP Journal of Technology, vol. 1, Nov. 1991, pp. 69–79.

Martyniuk J., "UV Laser–Assisted Wire Strippping and Micromachining", AMP Journal of Technology, vol. 4, Jun. 1995.

"LaserPulse," Electro Scientific Industries, Inc., Fall 1993, pp. 1–7.

Richard Harris et al., "MGM Micromachining: Nd:YAG UV Laser Process in a New Option," Electro Scientific Industries, Inc., Spring 1993.

"Etch–Stop Polymer Machining with an Argon Ion laser," IBM Technical Disclosure Bulletin, Jan. 1993, vol. 36, No. 1, Armonk, NY, US, p. 254.

"Dopant–Induced Excimer Laser Ablation of Poly(tetrafluoroethylene)," Applied Physics B: Photo Physics and Laser Chemistry, Mar. 92, vol. b54, No. 3, C.R. David et al.. pp. 227–230.

Friedrich G. Bachmann, "Large scale industrial application for excimer–lasers; via–hole–drilling by photo–ablation," SPIE, V. 1361, Physical Concepts of Materials for Novel Optoelectronic Device Applications, 1990, pp. 500–511.

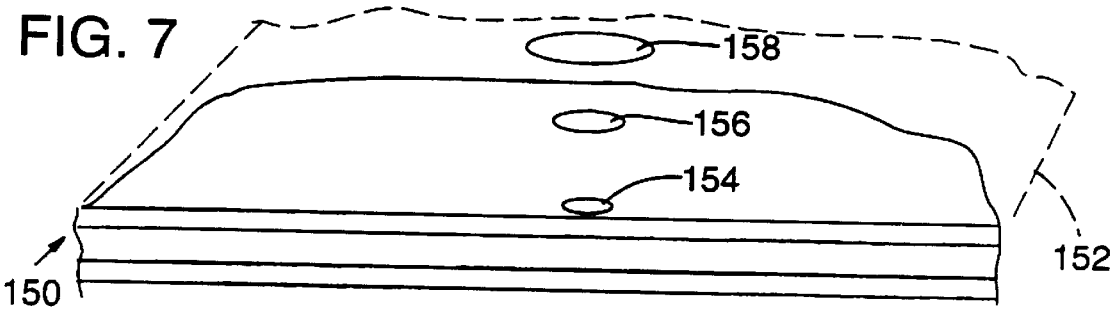
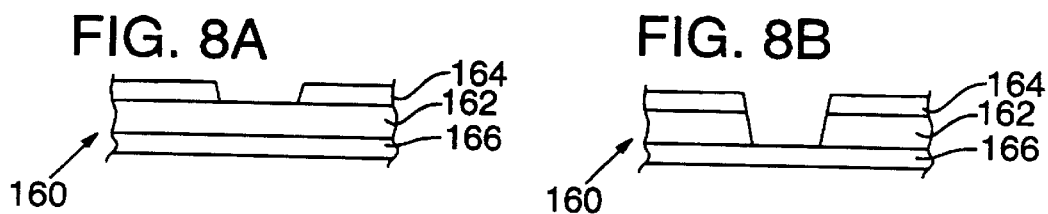
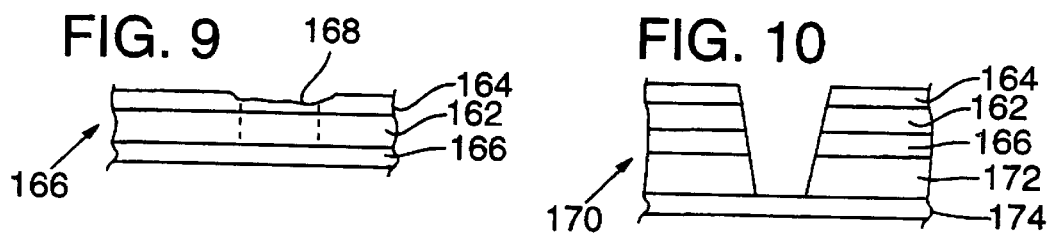
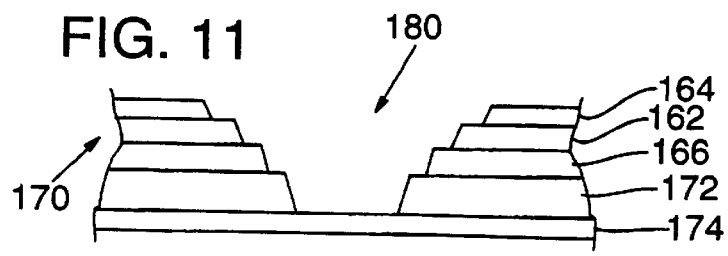

Fig. 12

Example 1 = 355 nm Laser

Step 1 = 15 μm Cu

Step 2 = 75 μm Aramid reinforced epoxy

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 150 | 1 | 4.712 | 1.4 | 470 | 3.36 | 1 | 17 | 28 | 3 | 14.67 | 50 |
| 150 | 2 | 4.712 | 0.248 | 100 | 19 | 1 | 17 | 28 | 2 | 22 | 50 |
| 200 | 1 | 4.712 | 1.4 | 470 | 3.36 | 1 | 17 | 28 | 4 | 17.25 | 50 |
| 200 | 2 | 4.712 | 0.248 | 100 | 19 | 1 | 17 | 28 | 3 | 23 | 50 |
| 250 | 1 | 4.712 | 1.4 | 470 | 3.36 | 1 | 17 | 28 | 5 | 18.8 | 50 |
| 250 | 2 | 4.712 | 0.248 | 100 | 19 | 1 | 17 | 28 | 4 | 23.5 | 50 |
| 300 | 1 | 4.712 | 1.4 | 470 | 3.36 | 1 | 17 | 28 | 7 | 18.79 | 50 |
| 300 | 2 | 4.712 | 0.248 | 100 | 19 | 1 | 17 | 28 | 5 | 26.3 | 50 |

Fig. 13

Example 2 = 355 nm Laser

Step 1 = 18 μm Cu

Step 2 = 51 μm (2 mil) polyimide with adhesive

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 100 | 1 | 2.62 | 6.54 | 630 | 4 | 1 | 25 | 0 | 2 | 12.5 | 50 |
| 100 | 2 | 2.61 | 0.217 | 90 | 12 | 2 | 25 | 0 | 1 | 25 | 50 |

Fig. 14

Example 3 = 355 nm Laser

Step 1 = 18 μm Cu

Step 2 = 42 μm thick SpeedboardN (PTFE + epoxy)

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 75 | 1 | 6.5 | 0.65 | 750 | 10 | 1 | | | | | 65 |
| 75 | 2 | 5.8 | 19.3 | 750 | 0.3 | 1 | 25 | 41 | 1 | 2 | 65 |
| 100 | 1 | 3.664 | 0.654 | 750 | 5.61 | 1 | 25 | 25 | 2 | 13.75 | 65 |
| 100 | 2 | 5 | 20 | 750 | 0.25 | 1 | 25 | 33 | 2 | 9.25 | 65 |
| 150 | 1 | 4.7 | 0.857 | 750 | 5.5 | 1 | 25 | 33 | 3 | 15.5 | 65 |
| 150 | 2 | 5 | 20 | 750 | 0.25 | 1 | 25 | 33 | 3 | 13.17 | 65 |
| 200 | 1 | 4.9 | 0.954 | 750 | 5.13 | 1 | 25 | 35 | 4 | 17.62 | 65 |
| 200 | 2 | 5 | 20 | 750 | 0.25 | 1 | 25 | 30 | 4 | 19.62 | 65 |

Fig. 15

Example 4 = 355 nm Laser

Step 1 = 36 μm Cu (1 oz)

Step 2 = 84 μm Epoxy

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 75 | 1 | 4 | 0.702 | 750 | 5.7 | 2 | 25 | 25 | 1 | 10 | 65 |
| 75 | 2 | 5.8 | 0.55 | 750 | 10.5 | 2 | 25 | | | | 65 |
| 100 | 1 | 4.1 | 1.323 | 750 | 3.1 | 1 | | 30 | 2 | 12.5 | 65 |
| 100 | 2 | 4.398 | 0.5 | 750 | 8.8 | 1 | 25 | 30 | 2 | 11.5 | 65 |
| 150 | 1 | 4 | 1.333 | 750 | 3 | 1 | 25 | 27 | 3 | 16.17 | 65 |
| 150 | 2 | 3.979 | 0.6 | 750 | 6.63 | 1 | 25 | 25 | 3 | 16.5 | 65 |
| 200 | 1 | 4.18 | 1.393 | 750 | 3 | 1 | 25 | 28 | 5 | 14.8 | 65 |
| 200 | 2 | 5 | 0.6 | 750 | 8.33 | 1 | 25 | 30 | 5 | 15.7 | 65 |

Fig. 16

Example 5 = 355 nm Laser

Step 1 = Cu

Step 2 = RFLEX 10001-828 Adhesive-Polyimide-Adhesive from Rodgers Corp.

| Via Size (μm) | Step | Speed (mm/sec) | Rep Rate (kHz) | Power (mW) | Bite Size (μm) | # of passes | Eff. spot (μm) | Spiral Params. | | | focus (mil) |
|---|---|---|---|---|---|---|---|---|---|---|---|
| | | | | | | | | id | rev | pitch | |
| 50 | 1 | 3.97 | 0.62 | 750 | 6.4 | 1 | 12 | | | | 50 |
| 50 | 2 | 3.97 | 0.217 | 750 | 18.29 | 1 | 12 | | | | 50 |
| 400 | 1 | 2.094 | 0.285 | 750 | 7.85 | 1 | 20 | 0 | 12 | 15 | 50 |
| 400 | 2 | 5.235 | 0.217 | 750 | 24.12 | 1 | 50 | 0 | 6 | 25 | 50 |

Fig. 17

Example 6 = 355 nm Laser

Step 1 = 1 36μm Cu

Step 2 = Dupont LF-9111 - 25.4 μm (1 mil) Kapton w/ 25.4 μm (1 mil) acrylic adhesive

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 50 | 1 | 3.97 | 0.75 | 750 | 5.29 | 1 | 15 | | | | 25 |
| 50 | 2 | 3.97 | 0.265 | 750 | 15 | 1 | 15 | | | | 25 |
| 200 | 1 | 5.445 | 1.555 | 750 | 3.5 | 1 | 15 | 27 | 4 | 15.38 | |
| 200 | 2 | 5.445 | 0.544 | 750 | 10 | 1 | 15 | 27 | 4 | 15.38 | |

Fig. 18

Example 7 = 355 nm Laser

Step 1 = 12 μm Cu

Step 2 = Thermount E220 from Nelco

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 12 | 1 | 4.8 | 1.1 | 400 | 4.36 | 1 | 15 | 28 | 2 | 15.25 | 65 |
| 140 | 2 | 5.13 | 0.267 | 100 | 19.36 | 2 | 15 | 31 | 1 | 29 | 65 |

Fig. 19

Example 8 = 355 nm Laser

Step 1 = 15 μm Cu

Step 2 = 50 μm Speedboard N (PTFE)

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| | 1 | 5.75 | 1.5 | 550 | 3.84 | 1 | 5 | 50 | 1 | 32.5 | 75 |
| | 2 | 5.75 | 5 | 700 | 1.15 | 1 | 5 | 50 | 1 | 32.5 | 150 |

Fig. 20

Example 9 = 266 nm Laser

Step 1 = 15 μm Cu

Step 2 = 50 μm Duramid Aramid Reinforced Epoxy

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 160 | 1 | 5 | 5 | 150 | 1 | 1 | 35 | 10 | 2 | 20 | 0 |
| 160 | 2 | 4.8 | 3.2 | 300 | 1.5 | 1 | 1 | | | | 0 |

Fig. 21

Example 10 = 266 nm Laser

Step 1 = 15 μm Cu

Step 2 = 50 μm Gore Speedboard N (PTFE)

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 160 | 1 | 5 | 5 | 150 | 1 | 1 | 35 | 10 | 2 | 20 | 0 |
| 160 | 2 | 4.5 | 3.75 | 305 | 1.2 | 1 | 1 | | | | 0 |

Fig. 22

Example 11 = 266 nm Laser
Step 1 = 15 μm Cu
Step 2 = 50 μm ISOLA 50 μm epoxy

| Via Size (μm) | Step | Speed (mm/sec) | Rep Rate (kHz) | Power (mW) | Bite Size (μm) | # of passes | Eff. spot (μm) | Spiral Params. | | | |
|---|---|---|---|---|---|---|---|---|---|---|---|
| | | | | | | | | id | rev | pitch | focus (mil) |
| 160 | 1 | 5 | 5 | 150 | 1 | 1 | 35 | 10 | 2 | 20 | 0 |
| 160 | 2 | 4.5 | 3 | 380 | 1.5 | 1 | | | | | 0 |

Fig. 23

Example 12

TEST RESULTS ON COPPER-CLAD EPOXY GLASS, GLASS POLYIMIDE, AND POLYIMIDE

| Sample | Via Diameter (μm) | Speed (mm/s) | Bite Size (μm) | Rep Rate (kHz) | # Passes | Taper (μm) | Throughput (holes/sec) |
|---|---|---|---|---|---|---|---|
| 1 | 102 | 8 | -- | 3.2 | 15 | 12 | 1.7 |
| 2 | 51 | 3.2 | -- | 1.6 | 10 | 12 | 2.4 |
| 3 | 102 | 7.8 | -- | 3.1 | 5 | 12 | 4.4 |
| 4 | 51 | 3.2 | -- | 2.1 | 2 | 12 | 7.8 |
| 5 | 25 | N/A | -- | 4 | 100 pulses | 12 | 15 |
| 6 | 102 | 7.6 | -- | 1.5 | 6 | 12 | 3.8 |
| 7 | 51 | 3.2 | -- | 1.6 | 4 | 12 | 5.3 |
| 8 | 102 | 8 | -- | +5 | 10 | 12 | 2 |
| 9 | 51 | 3.2 | -- | +20 | 1 | 12 | 3.7 |

Fig. 24

Power Density = Fluence/Pulse Width

| | Average Power | Spot Size Diameter | Spot Size Radius | Repetition Rate | Spot Area | Spot Area | Power/ Rep. Rate | Fluence | Power Density W/cm² | |
|---|---|---|---|---|---|---|---|---|---|---|
| | mW | micro-m | micro-m | Hz | m² | cm² | J | J/cm² | @40 ns | @90 ns |
| Example 12 | | | | | | | | | | |
| Sample 1 | 225 | 25 | 12.5 | 3200 | 4.91E-10 | 4.91E-06 | 7.03E-05 | 14.32 | 3.58 x 10⁸ | 1.59 x 10⁸ |
| Sample 2 | 225 | 25 | 12.5 | 1600 | 4.91E-10 | 4.91E-06 | 1.41E-04 | 28.72 | 7.18 x 10⁸ | 3.19 x 10⁸ |
| Sample 3 | 225 | 25 | 12.5 | 3100 | 4.91E-10 | 4.91E-06 | 7.26E-05 | 14.79 | 3.70 x 10⁸ | 1.64 x 10⁸ |
| Sample 4 | 225 | 25 | 12.5 | 2100 | 4.91E-10 | 4.91E-06 | 1.07E-04 | 21.79 | 5.45 x 10⁸ | 2.42 x 10⁸ |
| Sample 5 | 225 | 25 | 12.5 | 4000 | 4.91E-10 | 4.91E-06 | 5.63E-05 | 11.47 | 2.87 x 10⁸ | 1.27 x 10⁸ |
| Sample 6 | 225 | 25 | 12.5 | 1500 | 4.91E-10 | 4.91E-06 | 1.5E-04 | 30.5 | 7.63 x 10⁸ | 3.39 x 10⁸ |
| Sample 7 | 225 | 25 | 12.5 | 1600 | 4.91E-10 | 4.91E-06 | 1.41E-04 | 28.72 | 7.18 x 10⁸ | 3.19 x 10⁸ |
| Sample 8 | 225 | 25 | 12.5 | 5000 | 4.91E-10 | 4.91E-06 | 4.5E-05 | 9.16 | 2.29 x 10⁸ | 1.02 x 10⁸ |
| Sample 9 | 225 | 25 | 12.5 | 20000 | 4.91E-10 | 4.91E-06 | 1.13E-05 | 2.30 | 5.75 x 10⁷ | 2.56 x 10⁷ |

METHOD EMPLOYING UV LASER PULSES OF VARIED ENERGY DENSITY TO FORM DEPTHWISE SELF-LIMITING BLIND VIAS IN MULTILAYERED TARGETS

RELATED APPLICATION

This application is a continuation-in-part of U.S. Pat. application Ser. No. 08/276,797, filed Jul. 18, 1994, now U.S. Pat. No. 5,593,606.

TECHNICAL FIELD

The invention relates to lasers and, in particular, to a method and an apparatus for employing laser-generated ultraviolet light of varied power density to form depthwise self-limiting blind vias in targets having at least two layers with different thermal absorption characteristics in response to ultraviolet light.

BACKGROUND OF THE INVENTION

The background is presented herein only by way of example to multi-chip modules (MCMs), which are multi-material, multi-layered devices that are becoming one of the most preferred components of the electronics packaging industry for a variety of aerospace, computer, military, and telecommunications applications. MCMs are replacing or reducing the complexity of printed circuit boards, thus enhancing product efficiency and reliability. MCMs present, however, new manufacturing obstacles because MCMs require smaller vias and finer lines, and use a variety of new materials. Vias are discussed herein only by way of example and may take the form of complete through-holes or incomplete holes called blind vias.

MCMs and other multi-material, multi-layered electronic devices for packaging single chips such as ball grid arrays, pin grid arrays, circuit boards, and hybrid and semiconductor microcircuits typically include separate component layers of metal and an organic dielectric and/or reinforcement materials. The standard metal component layer(s) may contain aluminum, copper, gold, molybdenum, nickel, palladium, platinum, silver, titanium, or tungsten, or combinations thereof. These layers typically have a depth or thickness of about 9–36 $\mu$m (where $7.8 \times 10^{x3}$ kg of metal equals a thickness of about 9 $\mu$m), but may be thinner or as large as 72 Am. A standard organic dielectric layer may include bismaleimide triazine (BT), cardboard, cyanate esters, epoxies, phenolics, polyimides, or polytetrafluoroethylene (PTFE). These layers typically have a depth of about 50–400 $\mu$m. A standard reinforcement component "layer" may include fiber matts or dispersed particles of aramid fibers, ceramics, or glass woven or dispersed into the organic dielectric layer to reinforce it. These reinforcements typically have a diameter or thickness of about 1–10 $\mu$m. Stacks having several layers of metal, dielectric, and reinforcement material may be larger than 2 mm.

Traditional tools, punches, and production processes are designed for machining larger, less dense components. For example, well-known mechanical processes are either inadequate or prohibitively expensive for generating vias with diameters as small as 12 $\mu$m. Even when miniaturization is not the chief issue, mechanical processes are still inadequate. For example, laminate circuit board applications are plagued by the wear and breakage of mechanical drills on the laminate and therefore entail the frequent and expensive sharpening or replacement of tools. Furthermore, conventional chemical or wet processes cannot be used to etch certain materials, such as Teflon™ dielectrics. Finally, ion etching is very expensive and too slow to process MCMs and most other electronic components.

Much work has been directed toward developing laser-based micromachining techniques to process these types of electronic materials. However, laser types, operating costs, and laser- and target material-specific operating parameters such as beam wavelength, power, and spot size vary widely.

Conventional excimer lasers, for example, may generate laser output wavelengths from about 200 to 350 nm, but create poor quality multi-mode beam structures that simple lens elements cannot bring to a tight focus. Consequently, excimer laser output must be tailored by complex and expensive beam-shape controlling apertures or masks, often made from copper or other metallic material. Thus, the power density practically achievable with an excimer laser for via drilling is severely limited. These lasers are also generally limited to repetition rates of less than 200 Hz and are, therefore, too slow for deployment as a production tool for a variety of desirable applications. In addition, the high cost of excimer systems and their gases prevents their easy deployment and puts them beyond the reach of many small and mid-sized manufacturers. The halogen gases used in excimer laser processing chemically react with the components of the resonator and thereby cause degradation and frequent replacement. Moreover, halogen gases are materials that are hazardous, toxic, and damaging to the environment.

Because poor beam quality, large beam area, and low pulse rates are inherent to excimer lasers, beam-shape controlling masks are typically needed to efficiently use an excimer beam. The mask method forces ablation of a large area rather than at a point. Because debris from ablation is generated over a large area, subsequent laser pulses are partly blocked, or superheated debris change the nature of the ablation process to a more thermal process. As the power density is increased, an increasing amount of the target material can be ablated until a "saturation depth" of cut per pulse in a material is reached. The saturation depth imposes a practical limit in both the power density and repetition rate of an excimer laser that can be utilized to further increase the ablation rate, irrespective of whether the target is multi-layered.

Conventional $CO_2$ lasers, on the other hand, typically generate laser output wavelengths of about 10.6 $\mu$m, creating spot sizes that are too large for conventionally desirable via processing. As compared with ultraviolet lasers, $CO_2$ and other IR lasers have considerably longer pulse widths and much wider variance in the absorptivity of the organic materials and metals. These characteristics result in a destructively thermal, rather than photochemical, process.

Furthermore, because preimaged copper contact masks are so prevalent, the laser fluence must be set below the damage threshold of copper. This limits the types of materials that can be drilled and requires problematic cleaning steps, exacting layer to layer alignment, and copper etching.

SUMMARY OF THE INVENTION

An object of the present invention is, therefore, to provide an ultraviolet laser system and method for forming vias in targets having at least a conductor layer and a dielectric layer.

A preferred embodiment of the present invention triples or quadruples the frequency of the output of a continuously pumped, Q-switched, Nd:YAG laser to generate ultraviolet light output pulses at two different power densities, i.e., preferably two different pulse intensities or spot sizes. The parameters of the output pulses are selected to facilitate substantially clean, simultaneous drilling or via formation in a wide variety of materials such as metals, organic dielectrics, and reinforcement materials having different thermal absorption characteristics in response to ultraviolet light. These parameters typically include at least two of and preferably all of the following criteria: high average power of greater than about 100 milliwatts measured over the beam spot area, a temporal pulse width shorter than about 100 nanoseconds, and a repetition rate of greater than about 200 Hz.

The ability to generate ultraviolet light output pulses at two power densities facilitates the formation of depthwise self-limiting blind vias in multilayered targets. For example, a blind via can be formed in a target composed of a layer of dielectric material covered on either surface by a layer of metal. The blind via formation process entails first using beam pulses at a power density above the metal ablation threshold to machine through the metal layer and then using beam pulses at a power density below the metal ablation threshold but above the dielectric ablation threshold to machine through the dielectric material. The machining process provides a depthwise self-limiting blind via because via formation stops after the beam cuts through the dielectric material. The reason is that the beam pulse power density is insufficient to progress depthwise beyond the dielectric material to vaporize the remaining metal layer, even if beam pulses continue to strike the target.

The depthwise self-limiting capability in blind via formation is advantageous because multilayered targets can present unpredictable, inconsistent target depths that result from warpage, nonuniform layer thickness, or nonuniform flatness of the mounting fixture. Moreover, the ±0.25 millimeter focal length tolerance of the ultraviolet light laser facilitates the machining of nonuniformly thick targets.

In a first preferred embodiment, a first laser output of a high intensity is used to ablate a metallic layer, and a second laser output of lower intensity and equal spot size is used to ablate an underlying dielectric layer. This intensity change may be easily accomplished in a Nd:YAG laser, for example, by increasing the laser repetition rate to produce pulses of lower intensity. In a second preferred embodiment, a first laser output of high intensity is used to ablate a metallic layer, and a second laser output of equal intensity and greater spot size is used to ablate an underlying dielectric layer. In both embodiments, the energy density of the first laser output is greater than the energy density of the second laser output. In a third embodiment, both the intensity and spot size of the first and second laser outputs are varied.

An advantage of the present invention is that the laser system output pulses generated and the methods of using them eliminate the saturation limit on the power density ablation rate per pulse. This allows full use of the much higher pulse rate and ablation rate per pulse properties of the invention than those possible with like profile pulses produced by an excimer laser. This is true irrespective of whether the target is of single- or multi-layered material.

Additional objects and advantages of the present invention will be apparent from the following detailed description of preferred embodiments thereof, which proceeds with reference to the accompanying drawings.

BRIEF DESCRIPTION OF THE DRAWINGS

FIG. 7 is a diagram that shows qualitatively the differences in spot size that correspond to different distances between the target and the laser beam focal plane.

FIGS. 8A and 8B are fragmentary cross-sectional views showing the sequential steps carried out to form a depthwise self-limiting blind via of a target composed of a layer of dielectric material positioned between a top conductor layer and a bottom conductor layer.

FIG. 9 is a fragmentary cross-sectional view of an incomplete top layer opening for a via that can be machined in accordance with the present invention.

FIG. 10 is a fragmentary cross-sectional view of a target that is similar to the target of FIGS. 8A and 8B but has a second dielectric layer positioned between conductor layers.

FIG. 11 is a fragmentary cross-sectional view of the target of FIG. 10 but with a blind via characterized by a depthwise-stepped width of increasing diameter from a top conductor layer to a bottom conductor layer.

FIGS. 12–19 present tables of respective Examples 1–8 of parameters of laser pulses produced by a 355 nm laser system that are employed by the present invention.

FIGS. 20–22 present tables of respective Examples 9–11 of parameters of laser pulses produced by a 266 nm laser system that are employed by the present invention.

FIG. 23 presents a table of Example 12 of parameters of laser pulses employed to produce through-hole vias and blind vias; the blind vias were produced by processing the organic dielectric and the metal layers at different peak powers.

FIG. 24 presents a second table of Example 12, showing the conversion of the original data into fluences and power densities by well-known laser equations.

DETAILED DESCRIPTION OF PREFERRED EMBODIMENTS

Figure 1:
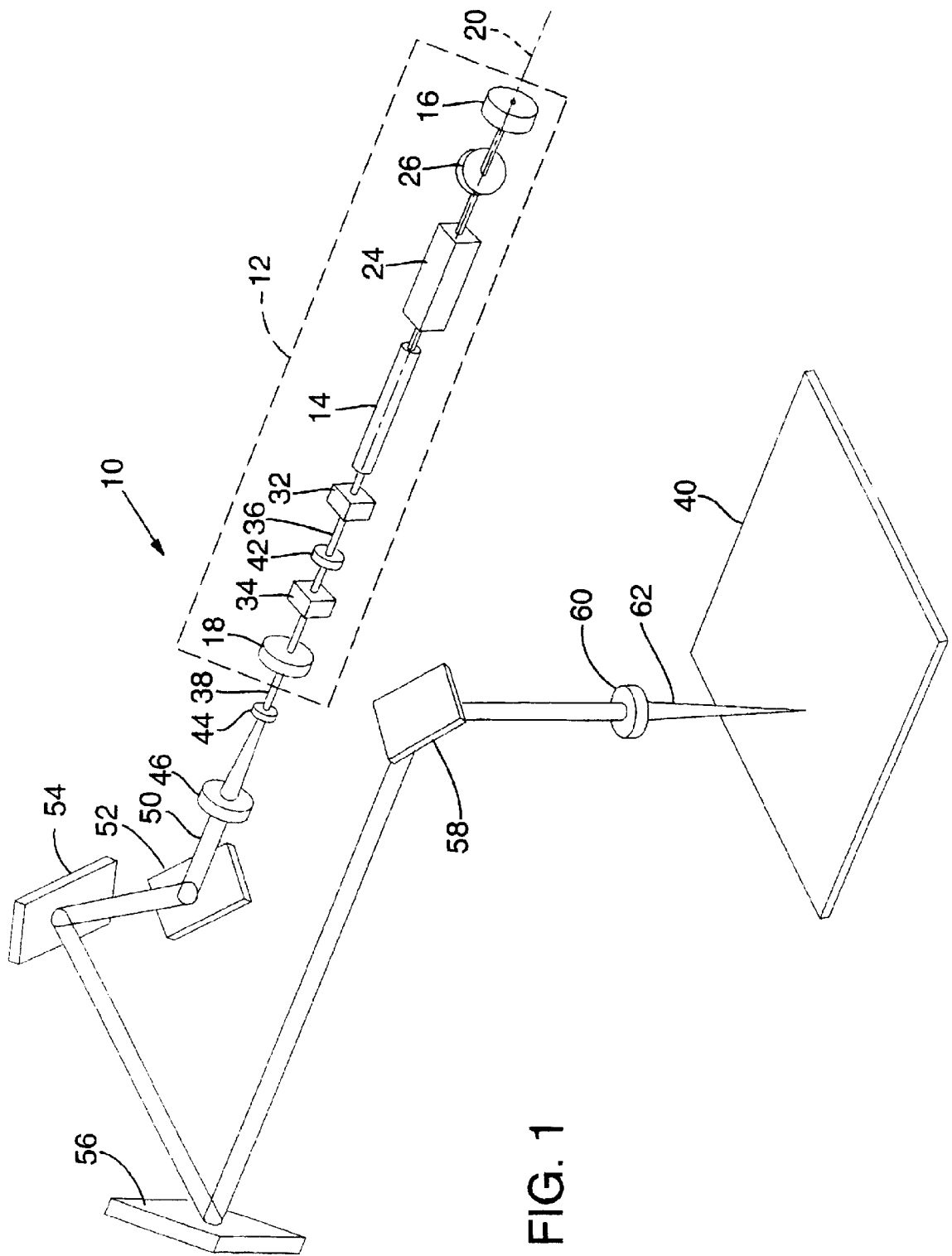
FIG. 1 is an isometric view of the components of a simplified laser system employed for generating desirable laser pulses in accordance with present invention.

With reference to FIG. 1, a preferred embodiment of a laser system 10 of the present invention includes a resonator 12 defined by a laser rod 14 positioned between a rear mirror 16 and an output mirror 18 along an optic axis 20. Mirror 16 is preferably 100% reflective, and mirror 18 is partly transmissive to light propagating along optic axis 20. Laser rod 14 preferably includes a solid-state lasant such as Nd:YAG, Nd:YLF, Nd:YAP, or Nd:YVO$_4$, or a YAG crystal doped with holmium or erbium. Laser rod 14 may be pumped by a variety of pumping sources (not shown) well known to persons skilled in the art, but a krypton arc lamp is or a suitable diode laser would be preferred for laser system 10 of the present invention.

Q-switches and their uses, positioning, and operation are also well known to persons skilled in the art. In laser system 10, a Q-switch 24 is preferably positioned within resonator 12 along optic axis 20 between laser rod 14 and mirror 16. The Q-switch may also be used as a pulse attenuator as described in U.S. Pat. No. 5,197,074, which is herein incorporated by reference.

The output of laser rod 14 is converted to a preferred ultraviolet wavelength through two stages of harmonic generation or frequency conversion. Second harmonic generation may be produced by a first frequency converter 32 such as a nonlinear crystal inserted along optic axis 20 and angle-tuned for optimum phase matching with the output of laser rod 14. Skilled persons will appreciate that there are numerous other techniques conventionally employed for phase matching. The amount of energy converted to the second harmonic is a function of a number of laser characteristics including peak power, mode structure, and beam divergence of the fundamental wavelength. Pertinent factors for selecting a particular nonlinear crystal include nonlinear coefficients, angular acceptance, and damage threshold.

In a preferred laser system 10 that is a continuously pumped, Q-switched, Nd:YAG laser, frequency doubling is efficiently accomplished with a barium borate crystal 32 positioned within resonator 12 along optic axis 20, as shown in FIG. 1. Skilled persons will appreciate that numerous other frequency converting crystals might be used, such as lithium borate.

The doubling process is enhanced by a Brewster plate polarizer 26 preferably positioned between rear mirror 16 and laser rod 14. In addition, output mirror 18 is selected to be highly reflective to the fundamental wavelength generated by laser rod 14 (1064 nm for a Nd:YAG) to increase the intracavity peak power, thereby increasing the harmonic conversion (to 532 nm) efficiency by as much as 80%.

A second frequency converter 34 (also preferably barium borate) is positioned along optic axis 20 between first frequency converter 32 and mirror 18 within resonator 12 to produce the third harmonic output 38 (355 nm) of the fundamental wavelength with a conversion efficiency of approximately 25%. The resonator output 36 may be separated into the two wavelengths, (532 nm and 355 nm) with one or more beamsplitters (not shown). The third harmonic output 38 at 355 nm may also be varied by rotating the input polarization of the 532 nm resonator output 36 with a polarization state changer 42 positioned along optic axis 20. Polarization state changer 42 may be a quarter-wave plate or a variable polarization state changer under operative control of a central processing unit (not shown) such as described in U.S. Pat. No. 5,361,268, which is herein incorporated by reference.

The third harmonic output 38 may be manipulated by a variety of well-known optics including beam expander lens components 44 and 46 that are positioned along beam path 50 before a series of beam-directing reflectors 52, 54, 56, and 58. Finally, the third harmonic output 38 is passed through a focusing lens 60 before being applied as processing output beam 62 to target 40. Variable apertures, adjustable collimators, or other variable lens elements may be substituted for or employed in addition to focusing lens 60 to modify the spatial spot size of processing output beam 62. Other preferred wavelengths of processing output beam 62 include 213 nm (frequently quintupled) and 266 nm (frequency quadrupled). Skilled persons will appreciate that frequency converter 34 and polarization state changer 42 would be preferably positioned external to resonator 12 if frequency quadrupling is desired.

Figure 2:
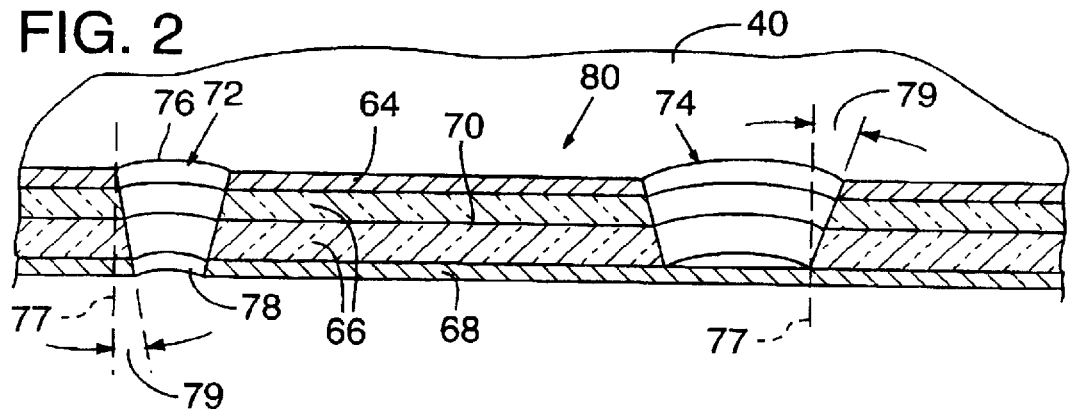
FIG. 2 is an enlarged sectional side elevation view of a multi-layered target having a through-hole and a blind via.

FIG. 2 is a cross-sectional side view of an enlarged portion of a generic laser target 40 that may, for example, be an MCM, capacitor, circuit board, resistor, or hybrid or semiconductor microcircuit. For convenience, target 40 is depicted as having only four layers 64, 66, 68, and 70.

Layers 64 and 68 may contain, for example, standard metals such as, aluminum, copper, gold, molybdenum, nickel, palladium, platinum, silver, titanium, tungsten, metal nitrides, or combinations thereof. Conventional metal layers vary in thickness, typically between 9–36 $\mu$m, but may be thinner or as thick as 72 $\mu$m. Layer 66 may, for example, contain a standard organic dielectric material such as benzocyclobutane (BCB), bismaleimide triazine (BT), cardboard, cyanate esters, epoxies, phenolics, polyimides, PTFE, various polymer alloys, or combinations thereof. Conventional organic dielectric layers 66 vary considerably in thickness, but are typically much thicker than metal layers 64 and 68. An exemplary thickness range for organic dielectric layers 66 is about 50–200 $\mu$m, but they may be placed in stacks as large as 1.6 mm. Layer 66 may also contain a standard reinforcement component or "layer 70." Layer 70 may be fiber matte or dispersed particles of, for example, aramid fibers, ceramics, or glass woven or dispersed into organic dielectric layer 66. Conventional reinforcement layers 70 are typically much thinner than organic dielectric layers 66 and may be on the order of 1-2 Am and perhaps up to 10 $\mu$m. Skilled persons will appreciate that reinforcement material may be introduced as powders into the organic dielectrics. The "layers 70" formed by such powdery reinforcement material may be noncontiguous and nonuniform. Skilled persons will also appreciate that layers 64, 66, and 68 may also be internally noncontiguous, nonuniform, and nonlevel.

Target 40 in FIG. 2 also depicts a through-hole via 72 and a blind via 74 produced by laser system 10. Through-hole 72 cleanly and evenly penetrates all layers and materials of target 40 and exhibits negligible taper from its top 76 to its bottom 78. Taper angle 79 is preferably less than 45°, more preferably less than 30°, and most preferably 0° with respect to normal axis 77.

Blind via 74 does not penetrate all layers and/or materials. In FIG. 2, blind via 74 stops at and does not penetrate layer 68. Thus, proper selection of the laser parameters permits layer 68 to remain unaffected even if it comprises the same metal component(s) as layer 64.

Via diameters preferably range from 25–300 $\mu$m, but laser system 10 may produce vias 72 and 74 that are as small as about 5–25 $\mu$m or much greater than 1 mm. Because the preferred spot size of output beam 62 is about 25–75 $\mu$m in diameter, vias larger than 25 $\mu$m may be produced by trepanning, concentric circle processing, or spiral processing.

Figure 3A:
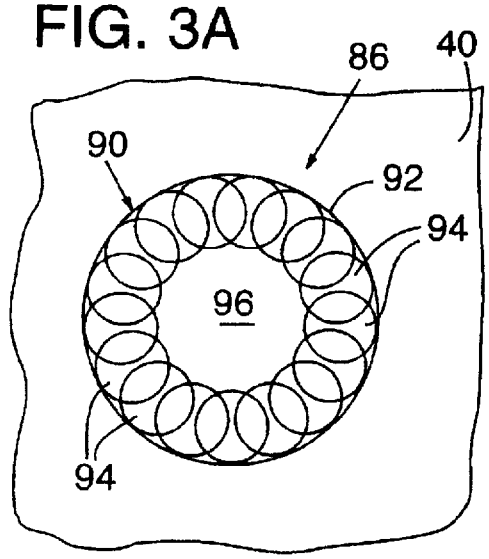
FIGS. 3A and 3B show cutting profiles for forming a through-hole and a blind via, respectively.
Figure 3B:
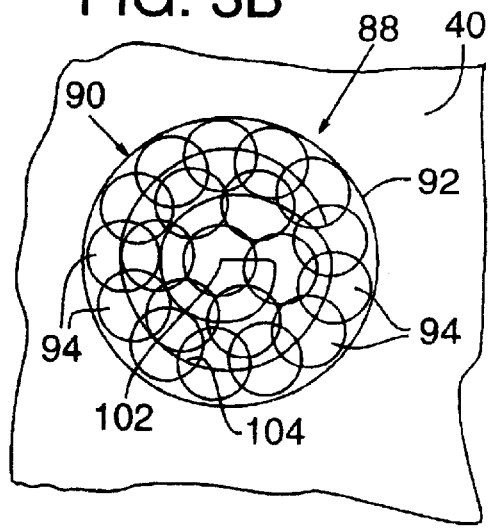

FIGS. 3A and 3B show cutting profiles for forming a through-hole 86 and a blind via 88, respectively, that are larger than the spot size of output beam 62. With reference to FIG. 3A, through-hole 86 defines on the surface of target 40 a circular spatial region 90 having a periphery 92. Output beam 62 has a spot area 94 that is less than the area of region 90. Through-hole 86 is formed by sequentially positioning beam 62 having spot area 94 at overlapping contiguous locations around periphery 92. Beam 62 is preferably moved continuously through each location at a speed sufficient for system 10 to deliver the number of beam pulses necessary to achieve the depth of cut at the location. After beam 62 completes the path around periphery 92, the center target material 96 falls out to form through-hole 86. This process is called trepanning.

With reference to FIG. 3B, blind via 88 also defines on the surface of target 40 a circular region 90 having a periphery 92. Output beam 62 having spot area 94 is initially positioned at the center 102 of region 90. Blind via 88 is formed by sequentially positioning beam 62 having spot area 94 at overlapping contiguous locations along a spiral path 104 to periphery 92. Beam 62 is preferably moved continuously through each location at a speed sufficient for system 10 to deliver the number of beam pulses necessary to achieve the depth of cut at the location. As beam 62 proceeds along spiral path 104, the target material is "nibbled" away to form a hole of increasing size each time beam 62 is moved to a new cutting location. The final shape of the hole is achieved when beam 62 moves along a circular path at periphery 92.

An alternative beam cutting path to form blind via 88 would be to start at center 102 and cut concentric circles of incrementally increasing radii defined by spot area 94 of beam 62. The overall diameter of via 88 would increase as the concentric circles forming via 88 travel in a circular path at greater distances from center 102 of region 90. Alternatively, this process may begin by defining the desired circumference and processing the edges toward the center.

Outward spiral processing tends to be a little more continuous and quicker than concentric circle processing. Skilled persons will appreciate that either target 40 or processing output beam 62 may be fixed or moved relative to the position of the other. In a preferred embodiment, both target 40 and processing output beam 62 are moved simultaneously.

Skilled persons will appreciate that noncircular vias may also be ablated through similar processes. Such vias may, for example, have square, rectangular, oval, slot-like, or other surface geometries. Several examples of through-hole vias and blind vias of various depths and diameters produced on a number of different substrates are set forth in U.S. Pat. application No. 08/276,797, which is incorporated herein by reference.

A benefit derived from solid-state laser system 10 is the ability to direct output beam 62 onto the surface of target 40 without the use of a beam-shape controlling mask, such as that used with an excimer laser. This is significant because depth of cut per pulse saturation can result when the beam spot area substantially equals the spatial region defined by the via intended to be cut. The saturation depth of cut per pulse is reached when an increase in power density of the beam pulse striking the target does not produce an appreciable increase of depth of cut into the target.

Because poor beam quality, large beam area, and low pulse rates are inherent to excimer lasers, beam-shape controlling masks are typically needed to efficiently use an excimer beam. The mask method forces ablation of a large area rather than at a point such that the effective beam spot area equals the desired spatial area of the via to be cut. Debris from ablation partly block subsequent laser pulses, or superheated debris change the nature of the ablation process to a more thermal process, creating a saturation depth that imposes a practical limit in both the power density and repetition rate of the excimer laser such that further increases cannot be utilized to further increase the ablation rate.

Figure 4:
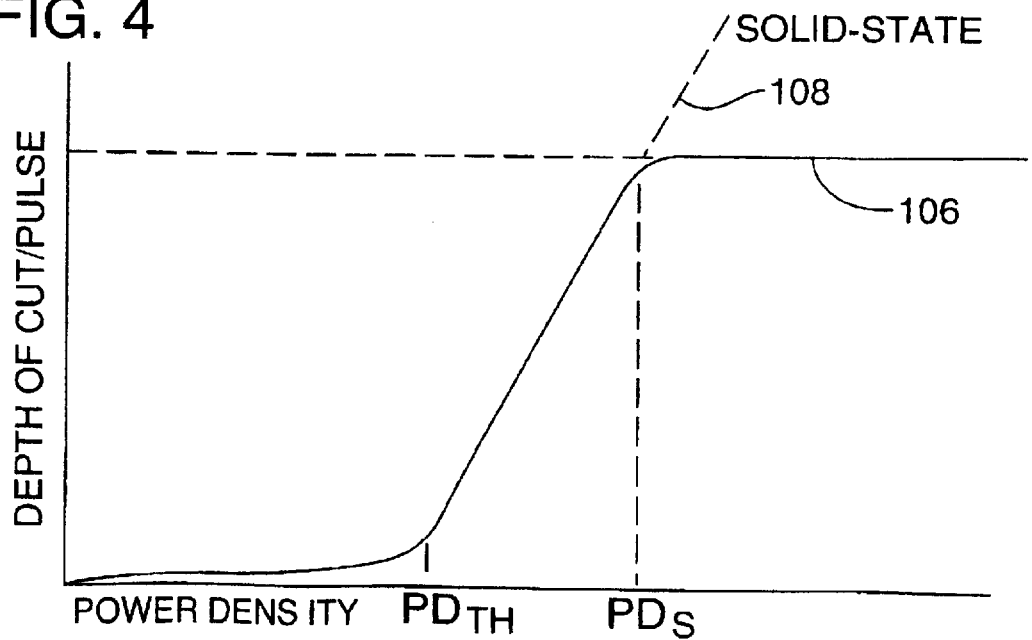
FIG. 4 is a depth of cut per pulse versus power density graph showing qualitatively the comparative relationship of the depth of cut per pulse achievable with an excimer laser and with the present invention.

FIG. 4 is a depth of cut per pulse versus power density graph showing qualitatively the comparative relationship of the depth of cut per pulse achievable with an excimer laser beam and an output beam of laser system 10. Curve 106 characterizes a pulsed excimer laser beam passing through a beam-shape controlling mask and striking a target. Curve 106 shows that an excimer beam pulse exceeding a threshold power density, PDTH, produces the depth of cut per pulse that increases linearly to a value, $t_s$, that corresponds to a saturation power density, $PD_s$. Further increases in excimer beam pulse power density produce no appreciable increase in depth of cut. Curve 108 characterizes output beam 62 of system 10 without the presence of a beam-shape controlling mask and tracks curve 106 for beam pulse power densities not exceeding $PD_s$. For increases in pulse power densities exceeding $PD_s$, output beam 62 continues the linear increase in depth of cut per pulse without saturation. System 10 is capable, therefore, of achieving depths of cut per pulse commensurate to the available beam pulse power density.

The parameters of processing output beam 62 are selected to facilitate substantially clean, sequential drilling, i.e., via formation, of a wide variety of metallic and dielectric material targets that exhibit different optical absorption and other characteristics in response to ultraviolet light (i.e., wavelengths shorter than about 400 nm). First, the metal layer is removed with a first laser output having a power density sufficient to ablate the metal. Then, the dielectric layer is removed with a second laser output having a lower power density that is insufficient to ablate the metal, so only the dielectric is removed. The two step method is especially useful for making blind vias having a metallic bottom layer, because the second laser output will not ablate it. Thus, the two-step machining method provides a depthwise self-limiting blind via because the second laser power output is insufficient to vaporize the metallic bottom layer, even if the second laser power output continues after the dielectric material is completely penetrated. Skilled persons will appreciate that the first and second laser outputs may be sequentially contiguous, or that a series of first laser outputs may be applied to an extended surface area of target 40 and then a series of second laser outputs may be applied over the same extended surface area.

Figure 5:
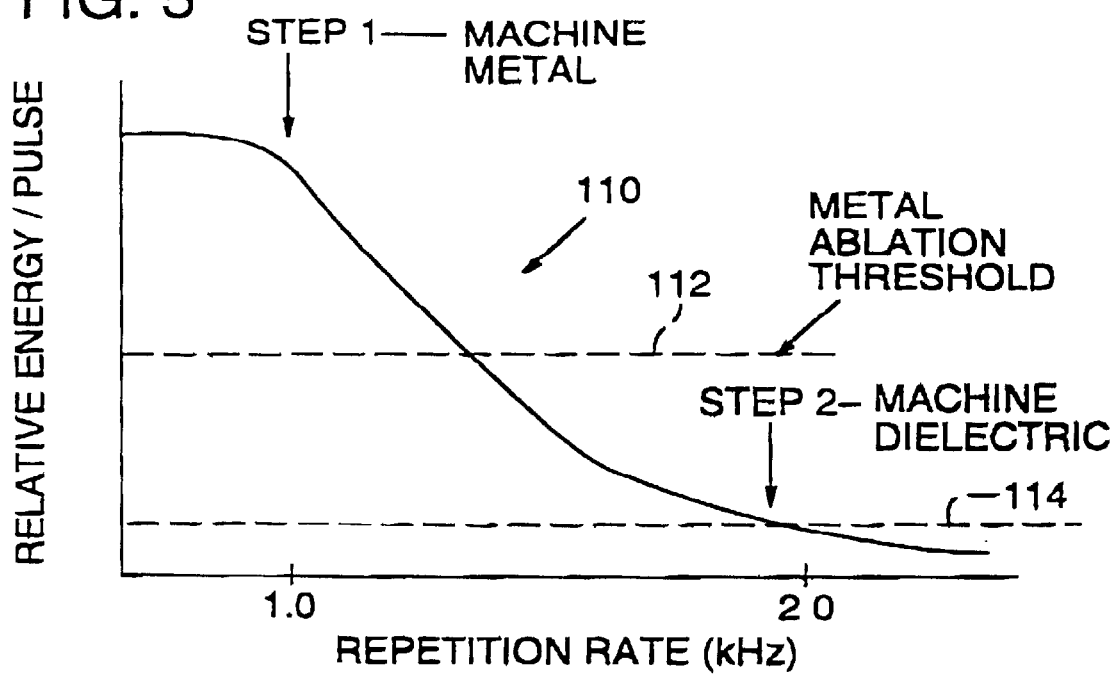
FIG. 5 is an energy per pulse versus repetition rate graph showing metal and dielectric ablation thresholds.

In a first preferred embodiment, as a first step a first laser output of a high intensity is used to ablate a metallic layer, and as a second step a second laser output of lower intensity and equal spot size is used to ablate an underlying dielectric layer. FIG. 5 represents one method for changing the intensity of Nd:YAG laser output by changing the repetition rate of laser system 10. FIG. 5 shows a graph 110 indicating that, for the conditions represented by Example 3 shown in FIG. 14, the energy per pulse (in unit energy values) of laser output varies inversely with the pulse repetition rate (in kHz). The energy of the first laser output is greater than metal ablation threshold 112, and the energy of the second laser output is below metal ablation threshold 112 but above dielectric ablation threshold 114. Thus, the second step can be carried out with any power density between thresholds 112 and 114 at 20 kHz.

Figure 6:
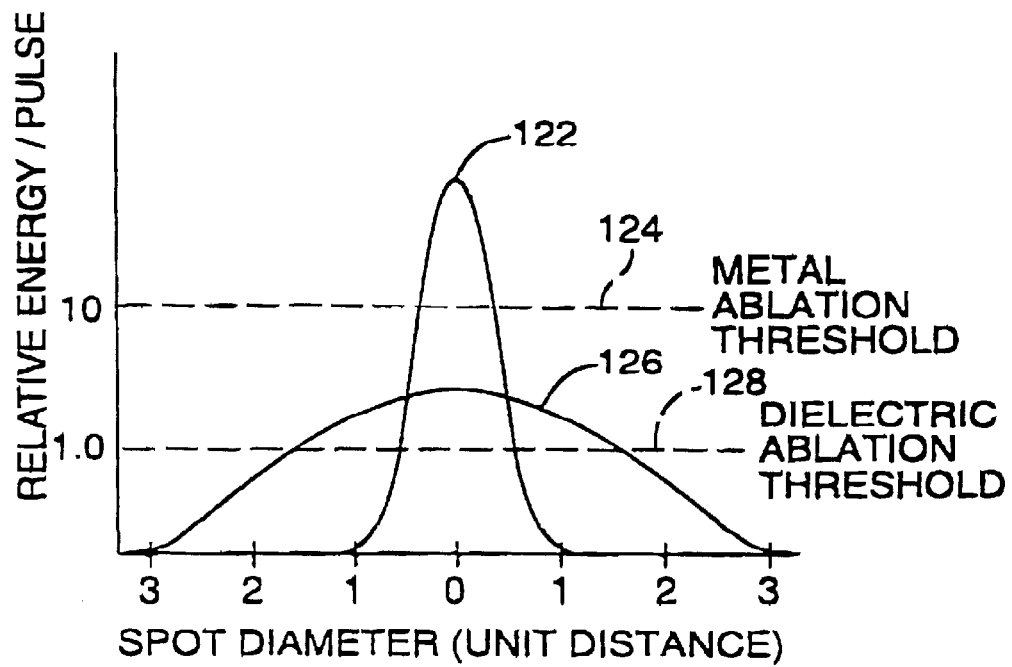
FIG. 6 is an energy per pulse versus spot diameter graph showing a profile of a first laser output pulse having energy sufficient to ablate metal and a second laser output pulse having energy sufficient to ablate dielectric but not ablate metal.

In a second preferred embodiment, a first laser output of high intensity is used to ablate a metallic layer, and a second laser output of equal intensity and greater spot size is used to ablate an underlying dielectric layer. FIG. 6 shows a graph 120 demonstrating the inverse relationship (in unit energy and distance values) between energy per pulse and the spot diameter. FIG. 6 shows an exemplary profile of a pulse of first laser output 122 having a spot diameter of 1 and sufficient energy (above metal ablation threshold 124) to ablate metal and an exemplary profile of a pulse of second laser output 126 having a spot diameter of 3 and sufficient energy (above dielectric ablation threshold 128) to ablate dielectric material but not to ablate metal.

In a third embodiment, the intensity of the second laser output is decreased and its spot size is increased relative to the intensity and spot size of the first laser output. As previously discussed with respect to FIG. 1, variable apertures, adjustable collimators, or variable lens elements may be employed to modify the spatial spot size between the first and second laser outputs.

FIG. 7 is a diagram showing qualitatively the differences in spot size that correspond to different distances between a target 150 and a laser beam focal plane 152. With reference to FIG. 7, spot area 154 represents the spot area corresponding to placement of target 150 at focal plane 152. Spot areas 156 and 158 represent progressively larger spot areas that correspond to placement of target 150 at respective positions of increasing closeness to or distance from the laser beam source (not shown) and therefore at increasing distances from focal plane 152.

Within these general embodiments, preferred parameters of the first laser output include average power densities greater than about 300 mW measured over the beam spot area; spot size diameters or spatial major axes of less than about 50 µm, and preferably from about 1–50 µm; and a repetition rate of greater than about 200 Hz, preferably greater than about 1 kHz or even 5 kHz; and an ultraviolet wavelength, preferably between about 180–355 nm. The preferred parameters of processing output beam 62 are selected in an attempt to circumvent certain thermal damage effects by utilizing temporal pulse widths that are shorter than about 100 ns, and preferably from about 40–90 ns or lower. Skilled persons will also appreciate that the spot area of output beam 62 is generally circular, but may be very slightly elliptical.

FIGS. 8A and 8B are fragmentary cross-sectional views showing the sequential steps carried out to form a depthwise self-limiting blind via of a target 160 composed of a layer 162 of dielectric material positioned between a top conductor layer 164 and a bottom conductor layer 166. Conductor layers 164 and 166 are typically made of the same material, such as copper. FIG. 8A represents the first step of delivering laser beam pulses at a first power density that is above the ablation threshold of conductor layer 164. FIG. 8B represents the second step of delivering laser pulses at a second power density that is below the ablation threshold of conductor layer 166 but above the ablation threshold of dielectric layer 162. This two-step method provides a depthwise self-limiting blind via because the laser beam power density is insufficient to progress depthwise beyond the dielectric material to vaporize conductor layer 166.

FIG. 9 is a fragmentary cross-sectional view of an incomplete top layer opening 168 for a hole or via (shown in phantom lines) that can be machined in accordance with the invention. The situation depicted in FIG. 9 typically arises in an incompletely chemically pre-etched metal top layer 164 that does not expose dielectric layer 162 in a target that was intended to be machined initially through the dielectric layer. The method steps described with reference to FIGS. 8A and 8B can be carried out to machine a via into the target.

FIG. 10 is a fragmentary cross-sectional view of a target 170 that is similar to target 160 but has a second dielectric layer 172 positioned between conductor layer 166 and a third conductor layer 174. Dielectric layer 172 and conductor layer 166 have ablation thresholds in the same relative proportion to those of dielectric layer 162 and conductor layer 166, respectively. Thus, conductor layers 166 and 174 become the respective middle and bottom conductor layers of target 170. To form a blind via in target 170, one repeats the first step by increasing the laser beam pulses to the first power density to machine through layer 166 and then repeats the second step by decreasing the laser beam pulses to the second power density to machine through dielectric layer 172 and stop at layer 174.

FIG. 11 is a fragmentary cross-sectional view of target 170 in FIG. 10 but with a blind via 180 characterized by a depthwise, stepped width of decreasing diameter from top layer 164 to bottom layer 174. The changes in width are accomplished by selectively decreasing the laser target area after each successive layer is penetrated.

FIGS. 12–19 and FIGS. 20–22 are tables of laser pulse parameters that present respective Examples 1–8 using a 355 nm laser and Examples 9–11 using a 266 nm laser to form blind vias in accordance with the present invention. These laser pulses and resulting vias were produced with a Model 4577 UV laser (355 nm) or a Model 4573 UV laser (266 nm) in a Model 5000 laser system manufactured by Electro Scientific Industries, Inc. in Portland, Oreg.

In FIGS. 12–22, step 1 and step 2 in the table heading generally list the depth or thickness and material(s) of the conductor layer 64 and dielectric layer 66 to which the first and second laser outputs 122 and 126 are respectively directed. In the column headings, via size indicates the top diameter (or longest lateral surface dimension where the vias are not circular). Step indicates whether first or second laser output 62 is employed and which of the materials(s) from the table headings is the target 40. Speed indicates the rate at which the laser output is moved relative to the surface of the target 40. The repetition (rep) rate indicates the number of laser pulses per second produced by laser system 10. Power indicates average power at the repetition rate of laser output 62. Bite size indicates the pulse overlap or "bite" of fresh material exposed by each pulse of laser output 62. Number (#) of passes indicates the number of spirals or "trepans" of laser output 62 used to form a via. Effective (Eff.) spot is a programmable correction for material machining differences. Spiral Parameters (Params.) indicate the inside diameter (id), number of revolutions from center to outside diameter (rev), spacing between revolutions of the spirals (pitch), and the distance (in µm or mils) from the target to the focal plane (focus). Skilled persons will appreciate that FIGS. 12–22 depict examples of only a few of the possible pulse and via parameters useful for implementing the present invention and that numerous variations are possible.

EXAMPLE 12

With reference to FIG. 23, through-hole vias and blind vias were produced on three-layered 305 µm epoxy glass/18 µm copper (samples 1, 2, and 8); three-layered, 102 µm epoxy glass/18 µm copper (samples 3–5); and three-layered glass polyimide/18 µm copper (samples 6, 7, and 9) targets. These experiments were performed with a 25 mm focal length lens resulting in an effective spot size of 25 µm. The through-holes were trepanned at a uniform power. The blind vias were produced by processing the organic dielectric and the metal layers at different peak powers The average output power was about 225 mW at repetition rates from 1.5–20 kHz. These vias were all produced with a Model 4575 UV laser (generally at 266 nm) in a Model 4420 laser system manufactured by Electro Scientific Industries, Inc.

Skilled persons will appreciate that the laser output data provided in the examples herein can be converted through well-known laser equations to additional laser output parameters that are inherent to this data. For example, skilled persons can calculate the laser fluence from the well-known equation: Fluence=(Average Power)/((Spot Area) (Rep Rate)); and the power density can be calculated from the well-known equation: Power Density=(Fluence/Pulse Width). FIG. 24 presents the fluence and power density values associated with the samples 1–9 in FIG. 23 in connection with other parameters provided for Example 12.

Skilled persons will also appreciate that target 40 may comprise multiple sets of conductor and dielectric layers 64 and 66 and that the first and second laser outputs 122 and 126 may be repeated to produce stepped, tapered, or vertically edged vias through the multiple sets of layers.

It will be obvious to those having skill in the art that various changes may be made in the details of the above-described embodiments of the present invention without departing from the underlying principles thereof. The scope of the present invention should, therefore, be determined only by the following claims.

We claim:

1. A method for laser machining a depthwise self-limiting blind via in a multilayered target including at least first and second conductor layers having respective first and second conductor ablation energy thresholds and a dielectric layer having surfaces and a dielectric ablation energy threshold, the first and second conductor layers positioned above and below, respectively, the surfaces of the dielectric layer and the first and second conductor ablation energy thresholds exceeding the dielectric ablation energy threshold, comprising:

generating, from a nonexcimer laser at a first repetition rate of greater than about 200 Hz. a first laser output having a wavelength of less than 400 nm and containing at least one first laser pulse having a first energy density over a first spatial spot size, the first energy density being greater than the first conductor ablation energy threshold;

applying the first laser output to the target to remove the first conductor layer within a spot area of the target;

changing the first repetition rate of the nonexcimer laser to a second repetition rate greater than the first repetition rate to decrease the first energy density to a second energy density over a second spatial spot size, the second energy density being less than the first and second conductor ablation energy thresholds;

generating. from the nonexcimer laser at the second repetition rate, a second laser output having a wavelength of less than 400 nm and containing at least one second laser pulse having the second energy density, the second energy density being greater than the dielectric ablation energy threshold; and applying the second laser output to the target to remove the dielectric layer within the spot area of the target and, as a consequence of the second energy density being less than the second conductor ablation energy threshold, to leave the second conductor layer substantially unvaporized and thereby form a depthwise self-limiting blind via.

2. The method of claim 1 in which the dielectric layer comprises benzocyclobutane (BCB), bismaleimide triazine (BT), cardboard, cyanate esters, epoxies, paper, phenolics, polyimides, PTFE, or combinations thereof and at least one conductor layer comprises aluminum, copper, gold, molybdenum, nickel, palladium, platinum, silver, titanium, tungsten, or combinations thereof.

3. The method of claim 2 in which the first and second laser outputs comprises the same waveleghth.

4. The method of claim 1 in which the first and second laser pulses have a temporal pulse width shorter than about 100 ns, the first and second laser outputs have an average output power of greater than about 100 mW measured over their respective spatial spot sizes.

5. The method of claim 1 in which the first and second laser outputs have respective first and second output powers, and the first output power is greater than the second output power.

6. The method of claim 5 in which the first second spatial spot sizes are the same.

7. The method of claim 5 further comprising changing the second output power relative to the first output power by employing a Q-switch, a polarization state changer, a quarter wave plate, or a Pockel's cell.

8. The method of claim 1 in which the first spatial spot size is smaller than the second spatial spot size.

9. The method of claim 8 in which the first and second laser outputs have respective first and second output powers that are substantially the same.

10. The method of claim 1 in which the first spatial spot size is less than about 100 $\mu$m across its surface diameter.

11. The method of claim 1 in which the first and second laser oututs are generated by a solid-state laser comprising Nd:YAG, Nd:YLF, NdYAP, or Nd:YVO$_4$.

12. The method of claim 1 in which the first spatial spot size defines a spot area that is smaller than and lies within a spatial region of the target, the spatial region having a periphery and a central portion, the method further comprising:

directing at least one of each of the first and second laser pulses sequentially to multiple positions associated with the spatial region to remove multiple amounts of target material corresponding to the spot areas, the multiple positions defining a contiguous set of spot areas extending outwardly from the central portion along a path to the periphery of the spatial region, to remove the target material from the spatial region and thereby produce a blind via in the target material.

13. The method of claim 1 in which the dielectric layer includes a reinforcement material that comprises glass, aramid fibers, ceramics, or combinations thereof.

14. The method of claim 1 in which the target comprises a circuit board.

15. The method of claim 1 wherein the first laser output is focused at a focal plane, further comprising:

positioning the target at a first distance relative to the focal plane prior to applying the first laser output; and positioning the target at a second distance, different from the first distance, relative to the focal plane prior to applying the second laser output, thereby modifying the second spatial spot size relative to the first spatial spot size.

16. The method of claim 15 in which the first and second laser outputs comprise the same wavelength.

17. The method of claim 1 further comprising employing variable apertures, adjustable collimators or variable lens elements to modify the second spatial spot size relative to the first spatial spot size.

18. The method of claim 1 in which the first and second laser outputs form a first set of laser outputs. the first and second conductor layers and the dielectric layer form a first set of layers and the target comprises at least a second set of layers, including a third conductor layer and a second dielectric layer, the second set of layers positioned atop the first set of layers such that the second dielectric layer is positioned between the first and third conductor layers, the method further comprising:

prior to generating and applying the first set of laser outputs, generating and applying a second set of first and second laser outputs to form a via through the third and conductor layer and the second dielectric layer.

19. The method of claim 18 in which the via is stepped between the first and second sets of layers.

20. The method of claim 1 in which the first and second laser outputs create a noncircular via.

21. The method of claim 1 in which the wavelength of the first and second pulses comprise 355 nm or 266 nm.

22. The method of claim 21 in which the second spatial spot size is greater than the first spatial spot size.

23. The method of claim 1 in which the second conductor layer absorbs at the wavelength of the second laser output and the second energy density remains below the ablation energy threshold of the second conductor layer.

24. The method of claim 1 in which the first and second laser outputs are generated by a solid-state, Q-switched laser.

25. The method of claim 1 in which the first and second laser outputs comprise the same wavelength.

26. A method for laser machining a blind via in a multilayered target including at least first and second conductor layers having respective first and second conductor ablation energy thresholds and a dielectric layer having surfaces and a dielectric ablation energy threshold, the first and second conductor layers positioned above and below, respectively, the surfaces of the dielectric layer, comprising:

generating, from a nonexcimer laser at a repetition rate of greater than about 200 Hz, a first laser output having a wavelength of less than 400 nm and containing at least one first laser pulse having a first energy density over a first spatial spot size and a temporal pulse width shorter than about 100 ns, the first energy density including an average output power of greater than about 100 mW measured over the first spatial spot size and being greater than the first conductor ablation energy threshold;

applying the first laser output to the target to remove the first conductor layer within a spot area of the target;

generating from a nonexcimer laser at a repetition rate greater than about 200 Hz, a second laser output having a wavelength of less than 400 nm and containing at least one second laser pulse having a second energy density over a second spatial spot size and a temporal pulse width shorter than about 100 ns, the second energy density including an average output power of greater than 100 mW, being greater than the dielectric ablation energy threshold, and being different from the first energy density; and applying the second laser output to the target to remove the dielectric layer within the spot area of the target to form a blind via.

27. The method of claim 26 for laser machining a depthwise self-limiting blind via in which the first and second conductor ablation energy thresholds exceed the dielectric ablation energy threshold, further comprising:

after removing the first conductor layer within the spot area, increasing the first repetition rate of the nonexcimer laser to the second repetition rate to decrease the first energy density to the second energy density, the second energy density being less than the first and second conductor ablation energy thresholds;

generating the second laser output at the second repetition rate; and applying the second laser output to the target to remove the dielectric layer within the spot area of the target and, as a consequence of the second energy density being less than the second conductor ablation energy threshold, to leave the second conductor layer substantially unvaporized and thereby form a depthwise self-limiting blind via.

28. The method of claim 26 in which the wavelengths of the first and second pulses comprise 266 nm.

29. The method of claim 28 in which the first and second energy densities comprise a fluence of greater than or equal to 14.79 J/cm$^2$.

30. The method of claim 28 in which the first and second energy densities comprise a power density of greater than or equal to $1.02 \times 10^8$ W/cm$^2$.

31. The method of claim 30 in which the first and second spatial spot sizes are less than 50 $\mu$m across their surface diameters.

32. The method of claim 26 in which the first and second laser outputs were generated at a repetition rate greater than or equal to 1.5 kHz.

33. The method of claim 26 in which the first and second laser outputs were generated at a repetition rate greater than 5 kHz.

34. The method of claim 26 in which the first and second laser outputs were generated at a repetition rate greater than 20 kHz.

35. The method of claim 26 in which the first and second spatial spot sizes are less than 50 $\mu$m across their surface diameters.

36. The method of claim 35 which the first and second spatial spot sizes are about 25 $\mu$m across their surface diameters.

37. The method of claim 26 in which the first and second laser outputs were generated at an average output power of greater than or equal to 225 mW.

38. The method of claim 26 in which the first and second energy densities comprise a fluence of greater than or equal to 2.30 J/cm$^2$.

39. The method of claim 38 in which the first and second energy densities comprise a fluence of greater than or equal to 14.79 J/cm$^2$.

40. The method of claim 39 in which the first and second energy densities comprise a fluence of greater than or equal to 28.72 J/cm$^2$.

41. The method of claim 36 in which the first and second energy densities comprise a power density of greater than or equal to $1.02 \times 10^8$ W/cm$^2$.

42. The method of claim 41 in which the first and second energy densities comprise a power density of greater than or equal to $7.18 \times 10^8$ W/cm$^2$.

43. The method of claim 26 in which the nonexcimer laser comprises a solid-state laser.

* * * * *

UNITED STATES PATENT AND TRADEMARK OFFICE
CERTIFICATE OF CORRECTION

PATENT NO. : 5,841,099

DATED : Nov. 24, 1998

INVENTOR(S) : Mark Owens, Bonnie A. Larson, and Jozef Van Puymbroeck

It is certified that error appears in the above-identified patent and that said Letters Patent is hereby corrected as shown below:

Column 1, line 44, "$7.8 \times 10^{x3}$" should read --$7.8 \times 10^{-3}$--.

Column 1, line 46, "72 Am" should read --72 $\mu$m--.

Column 4, line 63, "are" should read --arc--.

Column 6, line 24, "1-2 Am" should read --1-2 $\mu$m--.

Column 10, line 52, "powers" should read --powers.--.

Column 11, line 37, claim 1, line 26, "generating" should read --generating,--.

Column 11, line 58, claim 3, line 2, "comprises the same waveleghth" should read --comprise the same wavelength--.

Column 12, line 1, claim 6, line 1, "first second" should read --first and second--.

UNITED STATES PATENT AND TRADEMARK OFFICE
CERTIFICATE OF CORRECTION

PATENT NO. : 5,841,099
DATED : Nov. 24, 1998
INVENTOR(S) : Mark Owens, Bonnie A. Larson, and Jozef Van Puymbroeck It is certified that error appears in the above-identified patent and that said Letters Patent is hereby corrected as shown below:

Column 12, line 15, claim 11, line 2, "oututs" should read --outputs--.

Column 12, line 16, claim 11, line 3, "NdYAP" should read --Nd:YAP--.

Column 12, line 52, claim 18, line 2, "set of laser outputs." should read --set of laser outputs,--.

Column 13, line 1, claim 21, line 1, "wavelength" should read --wavelengths--.

Signed and Sealed this

Twentieth Day of July, 1999

Attest:

Attesting Officer

Q. TODD DICKINSON

Acting Commissioner of Patents and Trademarks

(12) EX PARTE REEXAMINATION CERTIFICATE (9092nd)
United States Patent
Owen et al.

(10) Number: US 5,841,099 C1
(45) Certificate Issued: Jun. 26, 2012

(54) METHOD EMPLOYING UV LASER PULSES OF VARIED ENERGY DENSITY TO FORM DEPTHWISE SELF-LIMITING BLIND VIAS IN MULTILAYERED TARGETS

(75) Inventors: Mark D. Owen, Portland, OR (US);
Bonnie A. Larson, Hillsboro, OR (US);
Jozef Van Puymbroeck, Oostkamp (BE)

(73) Assignee: Electro Scientific Industries, Inc., Portland, OR (US)

Reexamination Request:
No. 90/011,314, Nov. 3, 2010

Reexamination Certificate for:
Patent No.: 5,841,099
Issued: Nov. 24, 1998
Appl. No.: 08/651,036
Filed: May 17, 1996

Certificate of Correction issued Jul. 20, 1999.

Related U.S. Application Data

(63) Continuation-in-part of application No. 08/276,797, filed on Jul. 18, 1994, now Pat. No. 5,593,606.

(51) Int. Cl.
*B23K 26/38* (2006.01)
*B23K 26/00* (2006.01)
*B23K 26/40* (2006.01)
*C23C 14/04* (2006.01)
*C23C 14/28* (2006.01)
*H05K 3/00* (2006.01)
*H05K 3/40* (2006.01)
*H05K 3/02* (2006.01)

(52) U.S. Cl. .............. 219/121.69; 219/121.71; 219/121.85

(58) Field of Classification Search .............. 219/121.69
See application file for complete search history.

(56) References Cited

To view the complete listing of prior art documents cited during the proceeding for Reexamination Control Number 90/011,314, please refer to the USPTO's public Patent Application Information Retrieval (PAIR) system under the Display References tab.

*Primary Examiner* — Terrence R. Till

(57) ABSTRACT

The output of a continuously pumped, Q-switched, Nd:YAG laser (10) is frequency converted to provide ultraviolet light (62) for forming vias (72, 74) in targets (40) having metallic layers (64,68) and a dielectric layer (66). The invention employs a first laser output of high power density to ablate the metallic layer and a second laser output of a lower power density to ablate the dielectric layer. The parameters of the output pulses (62) are selected to facilitate substantially clean, sequential drilling or via formation. These parameters typically include at least two of the following criteria: power density first above and then below the ablation threshold of the conductor, wavelength less than 400 nm, a temporal pulse width shorter than about 100 nanoseconds, and a repetition rate of greater than about one kilohertz. The ability to generate ultraviolet light output pulses at two power densities facilitates the formation of depthwise self-limiting blind vias in multilayer targets, such as a target composed of a layer dielectric material covered on either surface by a layer of metal.

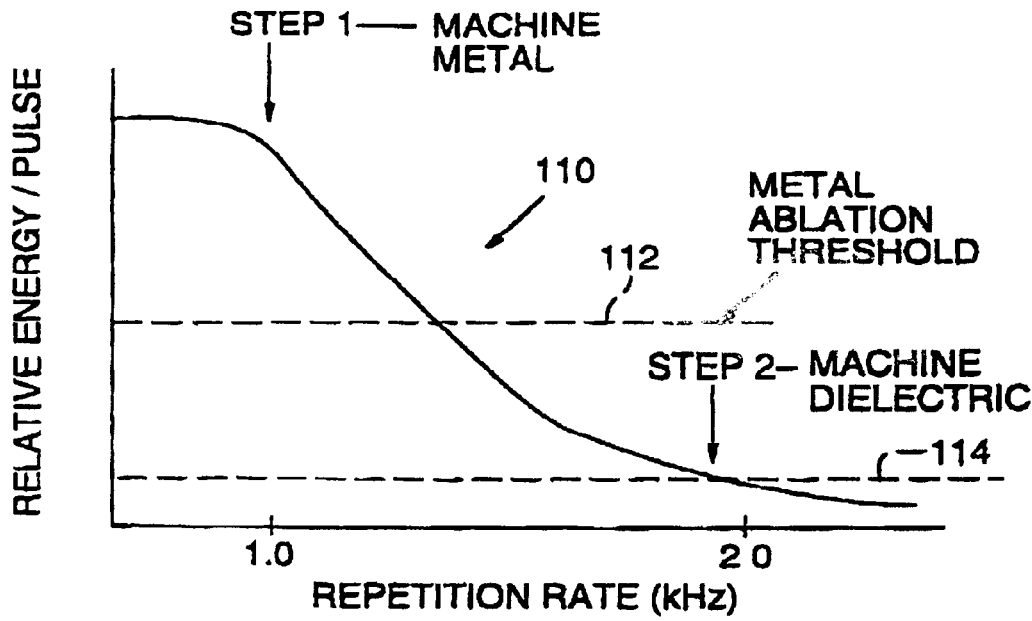

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 33 and 34 is confirmed.

Claims 26, 28-32 and 35-43 are cancelled.

Claims 1-25, 27 were not reexamined.

* * * * *